(12) United States Patent
Allen et al.

(10) Patent No.: US 8,008,975 B1
(45) Date of Patent: Aug. 30, 2011

(54) GATE-BOOSTED, VARIABLE VOLTAGE SUPPLY RAIL AMPLIFIER

(75) Inventors: Daniel J. Allen, Austin, TX (US); Eric J. Swanson, Buda, TX (US); Scott A. Woodford, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 12/415,788

(22) Filed: Mar. 31, 2009

(51) Int. Cl.
*H03F 3/04* (2006.01)

(52) U.S. Cl. .......................................... 330/297; 330/296

(58) Field of Classification Search .................. 330/297, 330/296, 285
See application file for complete search history.

(56) References Cited

U.S. PATENT DOCUMENTS

| | | | | |
|---|---|---|---|---|
| 5,880,638 A * | 3/1999 | Schaffer | | 330/255 |
| 6,297,698 B1 * | 10/2001 | Callahan, Jr. | | 330/254 |
| 6,636,098 B1 * | 10/2003 | Kizer | | 327/345 |
| 6,747,515 B2 * | 6/2004 | Callahan, Jr. | | 330/254 |
| 7,005,924 B2 * | 2/2006 | Can et al. | | 330/298 |

* cited by examiner

*Primary Examiner* — Henry K Choe
(74) *Attorney, Agent, or Firm* — Hamilton & Terrile, LLP; Kent B. Chambers

(57) ABSTRACT

In at least one embodiment, an electronic system includes an amplifier having an on-chip charge pump to provide a gate boost voltage to boost a gate voltage of at least one on-chip field effect transistor (FET) of an output stage of an amplifier. In at least one embodiment, the gate boost voltage boosts the gate voltage higher than the supply voltage rail to increase an overdrive voltage of the on-chip FET. In at least one embodiment, the gate boost voltage boosts the DC bias of an input signal and, thus, generation of gate boost voltage by the on-chip charge pump is signal-independent, i.e. independent of the input signal. Increasing the overdrive voltage increases the efficiency of the amplifier by decreasing the difference between the maximum swing of the output voltage and the voltage supply rails of the at least one on-chip FET relative to conventional designs.

29 Claims, 11 Drawing Sheets

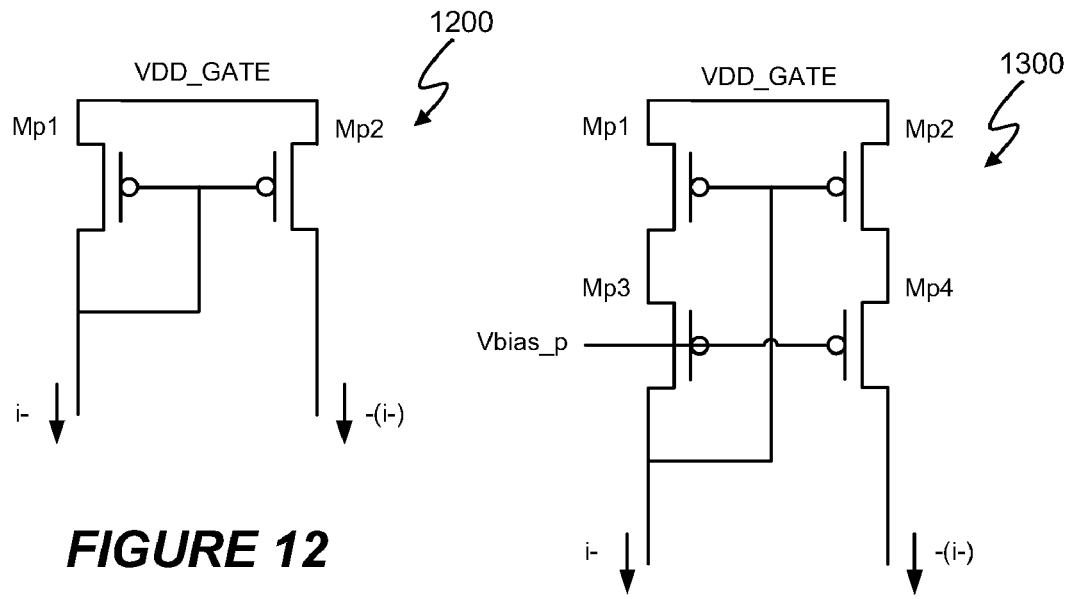
*FIGURE 12*
*FIGURE 13*
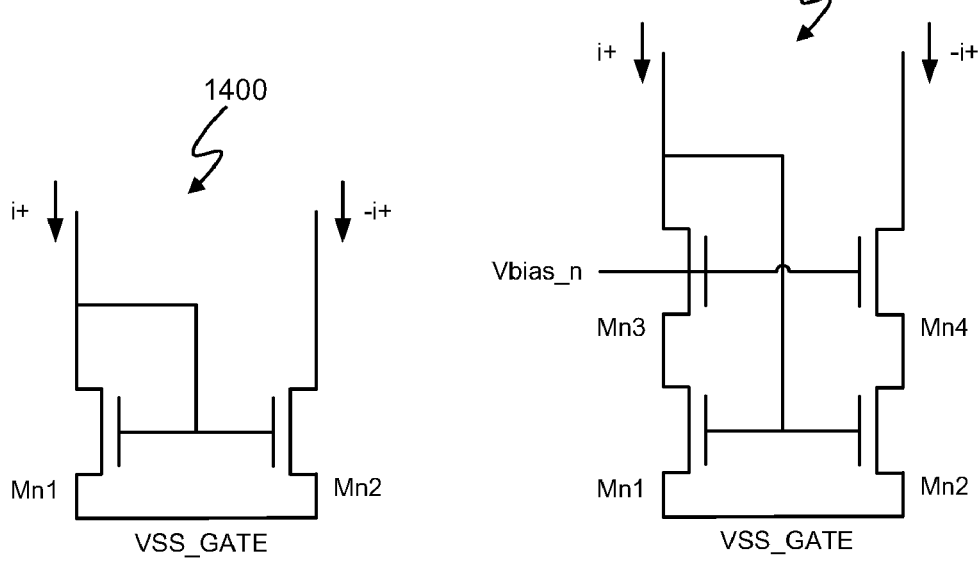
*FIGURE 14*
*FIGURE 15*

GATE-BOOSTED, VARIABLE VOLTAGE SUPPLY RAIL AMPLIFIER

BACKGROUND OF THE INVENTION

1. Field of the Invention

The present invention relates in general to the field of signal processing, and more specifically to a system and method that includes a gate-boosted, variable voltage supply rail amplifier.

2. Description of the Related Art

Electronic systems often include amplifiers. In general, amplifiers change power and/or amplitude of a signal Amplifiers are used in a large variety of applications, such as audio applications. A variety of amplifier designs exist. Amplifiers are often classified according to the amplifier's input and output properties, such as class A, class B, class AB, and so on. A class A amplifier is generally inefficient because a class A amplifier is always conducting, even with no input signal. Class B amplifiers amplify only one-half of an input signal wave form. Class B amplifiers are often combined into a push-pull pair. However, class B push-pull pairs often experience cross-over distortion where the two wave form halves of the push-pull pair join. Class AB amplifiers are similar to class B push-pull pairs except that class AB amplifiers always conduct.

An amplifier is most efficient when the peak-to-peak voltage swing of an output signal is equal to the amplifier supply voltage rails. The voltage "swing" refers to a maximum voltage that a signal can achieve prior to clipping of the signal. Class H control increases the efficiency of an amplifier efficiency by varying supply voltage rails so that peak output signal voltages are closer to the supply voltage rails. Class H control can be applied to any amplifier class.

FIG. 1 depicts an electronic system 100 with a class AB amplifier 102 and class H controller 120. The amplifier 102 is wholly fabricated on a semiconductor chip referred to herein as integrated circuit 104. The integrated circuit 104 includes a double-ended amplifier 106 that converts complementary voltage input signals $V_{IN}+$ and $V_{IN}-$ into signals i− and i+. The complementary signals i− and i+ are voltage level shifted by respective NMOS and PMOS gate drive level shifters 108 and 110. "NMOS" stands for n-channel metal oxide semiconductor, and "PMOS" stands for p-channel metal oxide semiconductor. The level shifters 108 and 110 shift the direct current (DC) voltage bias of signals i− and i+ and reverse direction of signals i− and i+ but do not provide current gain. The current of signal i+ is subtracted from current $i_q$ at the gates of PMOS field effect transistors (FETs) Q1 and Q2. The current $i_q$ is subtracted from the signal i− at the gates of NMOS FETs Q3 and Q4. Current $i_q$ is supplied by respective constant current sources 112 and 114.

FIG. 2 depicts voltage waveform 202 and waveform 204 representing respective gate voltages. Referring to FIGS. 1 and 2, waveform 202 represents the gate voltage $V_{G12}$ of FETs Q1 and Q2. Waveform 204 represents the gate voltage $V_{G34}$ of FETs Q3 and Q4. The gate voltage $V_{G12}$ and, thus, the gate-to-source voltage $V_{GS12}$ of FETs Q1 and Q2 increases as signal i+ increases. The gate voltage $V_{G34}$ and, thus, the gate-to-source voltage $V_{GS34}$ of FETs Q3 and Q4 increases as signal i− increases.

Electronic system 100 includes a charge pump 116. Charge pump 116 is a power supply that provides supply voltage rails VDD_classB and VSS_classB. Because of the potential power demands by load 122, capacitors used by charge pump 116 are too large to be efficiently fabricated on-chip as part of integrated circuit 104. Load 122 can be any load, such as an audio speaker. So, charge pump 116 includes an off-chip capacitor network 118 to provide the capacitors used by charge pump 116. The off-chip capacitor network 118 is connected to integrated circuit 104 via pins 124 and 126.

Electronic system 100 also includes a class H controller 120 to control the voltage levels of supply voltage rails VSS_classB and VDD_classB generated by charge pump 116. For example, for a tri-mode charge pump, charge pump 116 generates output voltages +/−VCP, +/−VCP/2, and +/−VCP/3. VDD_classB equals +VCP/N, and VSS_classB equals −VCP/N, where N is an integer ranging from 1 to 3 for a tri-mode charge pump. Class H controller 120 receives input signals $V_{in}+$ and $V_{in}-$ and determines a value of N based on the value of output voltage $V_{OUT}$ corresponding to input signals $V_{in}+$ and $V_{in}-$. Class H controller 120 generates control signal $N_{SELECT}$ to control the mode of charge pump 116. Class H controller 120 provides control signal $N_{SELECT}$ to charge pump 116. Control signal $N_{SELECT}$ represents the value of N. Class H controller 120 receives as inputs, input signals. Class H controller 120 sets the value of N to the minimum possible value for a given level of output signal $V_{OUT}$. For example if the swing of output voltage $V_{OUT}$ is less than ±VCP/3, class H controller 120 sets N equal to 3. If the swing of output voltage $V_{OUT}$ is greater than ±VCP/3 but less than ±VCP/2, class H controller 120 sets N equal to 2. If the swing of output voltage $V_{OUT}$ is greater than ±VCP/2, the class-H controller 120 sets N equal to 1. Thus, efficiency of the class H controlled amplifier is better than class AB amplifiers alone because by lowering the supply voltage rails, efficiency of amplifier 102 increases because amplifier 102 delivers more power to load 122 rather than being wasted as voltage drops across FETs Q2 and Q4. Maximum efficiency is achieved when the swing of output signal $V_{OUT}$ is equal to the voltage between voltage supply rails VDD_classB and VSS_classB.

Electronic system 100 also includes class AB controller 121. Class AB controller 121 is connected to the drains of transistors Q1 and Q2 and controls conductivity of transistors Q1 and Q2 so that amplifier 102 operates as a class AB amplifier.

Higher power applications generally require thicker deposited gate oxide layers. Thus, as power demands by load 122, electronic system 100 is fabricated with thicker gate oxides for FETs Q2 and Q4. Thicker gate oxides increase the threshold voltage $V_{TH}$ of FETs Q2 and Q4. The overdrive voltage $V_{OV}$ equals $V_{GS}-V_{TH}$. Thus, as the threshold voltage $V_{TH}$ increases, for a given set of voltage supply rails VDD_classB and VSS_classB, the overdrive voltage $V_{OV}$ available for FETs Q2 and Q4 decreases. Increases in the signal swing of output voltage $V_{OUT}$ correspond to larger overdrive voltage $V_{OV}$ demands. Charge pump 116 is designed to provide sufficient supply voltage rails VDD_classB and VSS_classB for anticipated swings of output voltage $V_{OUT}$. Because, maximum efficiency is achieved when the swing of output signal $V_{OUT}$ is equal to the voltage between voltage supply rails VDD_classB and VSS_classB, the gate voltages $V_{G12}$ and $V_{G34}$ of FETs Q2 and Q4 are limited to voltage supply rails VDD_classB and VDD_classB, which also limits the overdrive voltage $V_{OV}$.

For example, if the maximum charge pump 116 output voltage VCP is 1.8V, ±VCP/3=±0.6V, and the gate voltage $V_{G12}$ can only go down −VCP/3. Thus, the maximum gate-to-source voltage $V_{GS12}$ is 1.2V. For a 5V, thick oxide FET Q2, the maximum overdrive voltage of FET Q2 is approximately 200 mV. Thus, for N=3, VDD_classB=600 mV, and VSS_classB=−600 mV, the swing of output signal $V_{OUT}$ is limited to approximately +/−250 mV before class H controller 120 switches N from 3 to 2.

FIG. 3 depicts a variable voltage supply rail plot 300 over time for various swing levels of output voltage $V_{OUT}$. The value of N generated by class H controller 120 tracks the swing of output signal $V_{OUT}$ causing charge pump 116 to generate voltage supply rails VDD_classB and VSS_classB to track the swing of output voltage $V_{OUT}$. The value of N generated by class H controller 120 tracks the swing of output signal $V_{OUT}$. Until time $t_0$, N class H controller 120 sets N equal to 3. The swing of output voltage $V_{OUT}$ increases, and at time $t_0$, class H controller 120 sets N equal to 2. At time $t_1$, class H controller 120 sets N equal to 3. The maximum available overdrive voltage $V_{OV}$ prevents the output voltage $V_{OUT}$ from reaching the supply voltage rails VDD_classB and VSS_classB. Values of N greater than 3 do not work because of limitations in the maximum overdrive voltage $V_{OV}$.

SUMMARY OF THE INVENTION

In one embodiment of the present invention, an apparatus includes an amplifier having a first on-chip field effect transistor (FET), wherein the first on-chip FET includes a gate, a source, and a drain, wherein during operation of the first on-chip FET, the first on-chip FET operates from a first voltage supply rail supplied by a power supply. The apparatus also includes a first on-chip charge pump, coupled to the first on-chip FET, to generate a gate boost voltage to boost a gate voltage of the gate of the first on-chip FET, wherein the first on-chip charge pump is distinct from the power supply.

In another embodiment of the present invention, a method includes generating a first supply voltage rail to supply a voltage to a first on-chip field effect transistor (FET) of an output stage of an amplifier. The method also includes generating a first gate boost voltage to boost a gate voltage of a gate of the first on-chip FET, wherein the first gate boost voltage is generated by a first on-chip charge pump that is distinct from a power supply generating the supply voltage rail.

In a further embodiment of the present invention, an apparatus includes a first field effect transistor (FET) and a second FET, coupled to the first FET. The first and second FETs are configured to comprise an output stage of an amplifier. The apparatus also includes a power supply to provide at least one voltage rail to at least one of the first and second FETs, a first level shifter coupled to a gate of the first FET, and a second level shifter coupled to a gate of the second FET. The apparatus further includes a first on-chip charge pump, coupled to at least one of the first and second level shifters, to provide a gate boost voltage to the first and second level shifters to boost a gate voltage of at least one of the first and second FETs.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIGS. 12-13 depict respective embodiments of an NMOS gate drive level shifter of the electronic system of FIG. 5.

FIGS. 14-15 depict respective embodiments of a PMOS gate drive level shifter of the electronic system of FIG. 5.

DETAILED DESCRIPTION

Figure 1:
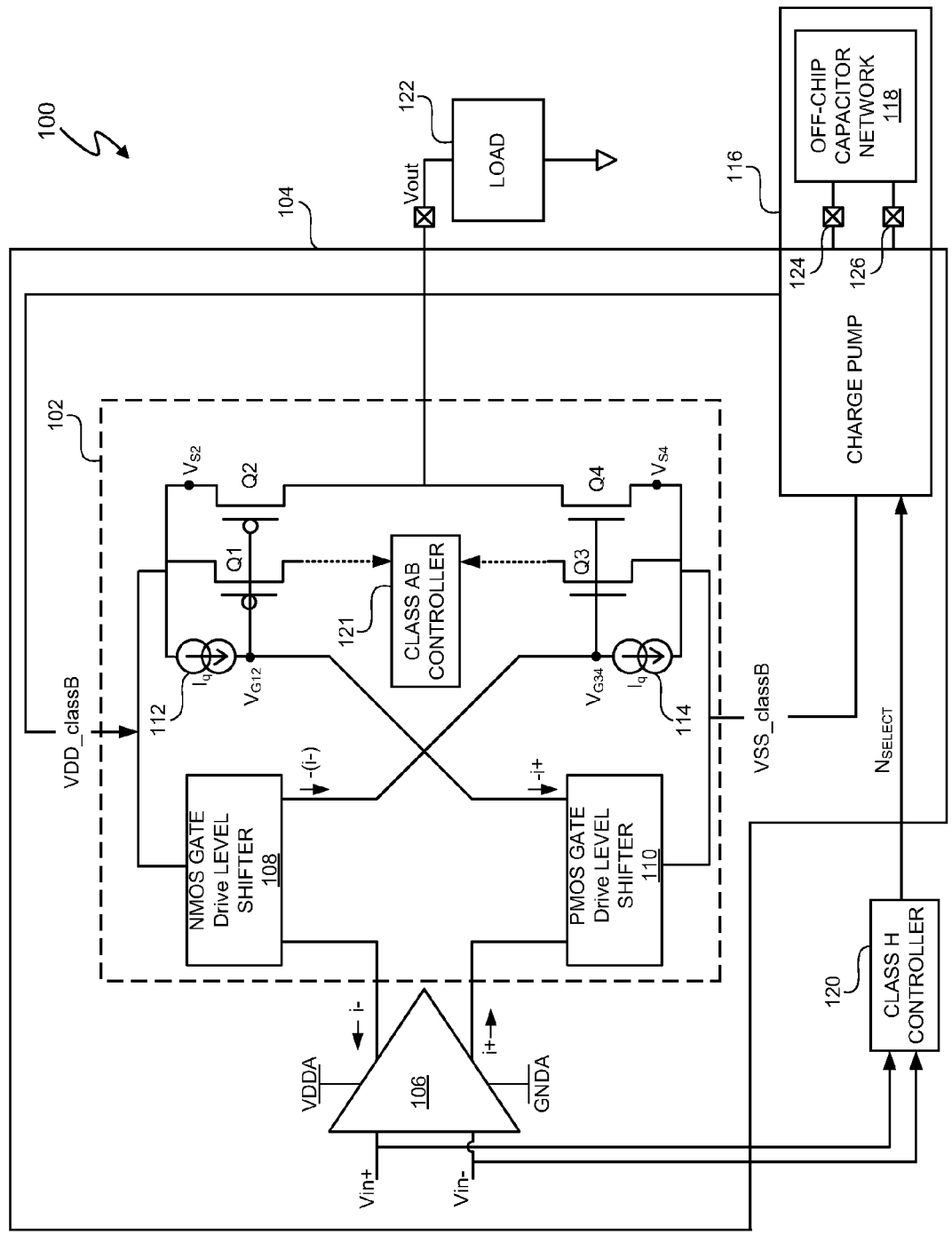
FIG. 1 (labeled prior art) depicts an electronic system with a class AB amplifier and class H controller.
Figure 2:
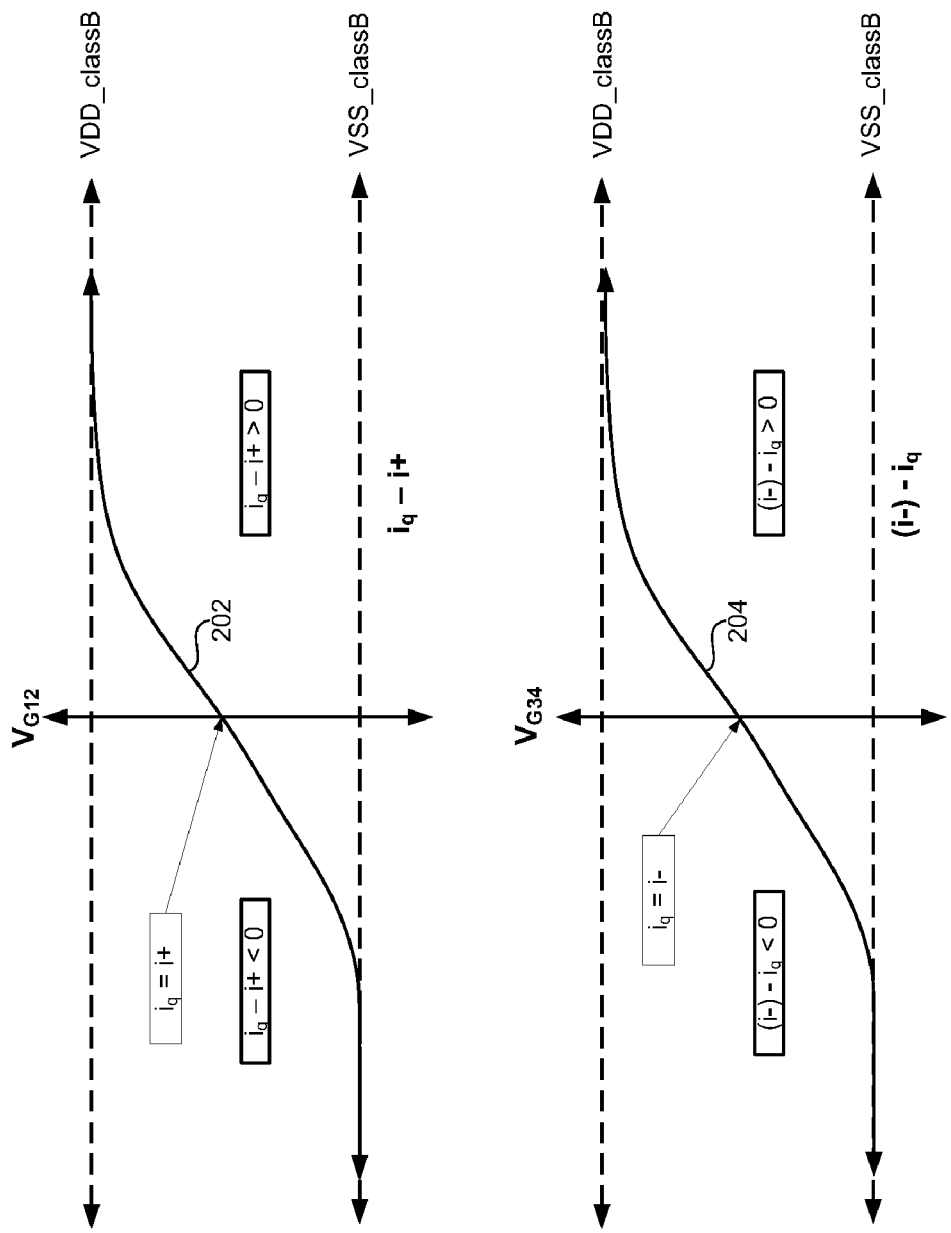
FIG. 2 (labeled prior art) depicts output stage, FET gate voltages.

The conventional charge pump with on-chip and off-chip components offers some simplicity in that the conventional charge pump provides gate boost voltages and supply voltage rails. However, the class H control prevents the gate boost voltage from exceeding the supply voltage rails. Thus, the overdrive voltage to the amplifier FETs is limited and significantly restricts the output voltage swing for a given voltage supply rail.

In at least one embodiment, an electronic system includes an amplifier having an on-chip charge pump to provide a gate boost voltage to boost a gate voltage of at least one on-chip field effect transistor (FET) of an output stage of an amplifier. In at least one embodiment, the gate boost voltage boosts the gate voltage higher than the supply voltage rail to increase an overdrive voltage of the on-chip FET. In at least one embodiment, the gate boost voltage boosts the DC bias of an input signal and, thus, generation of gate boost voltage by the on-chip charge pump is signal-independent, i.e. independent of the input signal. Increasing the overdrive voltage increases the efficiency of the amplifier by decreasing the difference between the maximum swing of the output voltage and the voltage supply rails of the at least one on-chip FET relative to conventional designs. Thus, in at least one embodiment, boosting the overdrive voltage improves the efficiency of the amplifier by allowing the output voltage delivered to the load by the amplifier to swing closer to the supply voltage rail than a conventional class H controlled amplifier. Additionally, boosting the overdrive voltage accommodates increasingly lower supply voltage rail division.

Since the on-chip charge pump supplies charge to boost the gate voltage of the FET and the FET has a high input impedance, the on-chip charge pump can be relatively small and still provide sufficient gate boost voltage.

The on-chip charge pump is distinct from a power supply that supplies a voltage rail to the on-chip FET. In at least one embodiment, the electronic system includes a variable supply voltage rail controller, such as a class H controller, to vary the supply voltage rail to the on-chip FET in accordance with, for example, swings of an output voltage delivered by the amplifier to a load.

In at least one embodiment, the current used to boost the gate voltage of the on-chip FET is low enough to allow the charge pump to be fabricated completely on-chip including all charge storage devices, such as capacitors, included in the charge pump. The amplifier can be configured as any type of amplifier, such as class A, class B, class AB, or class D amplifier. Thus, the amplifier can include one or more additional FETs, such as FETs in an output stage of the amplifier. In at least one embodiment, a gate voltage of the additional one or more output stage FETs is also boosted by gate boost voltage generated by the on-chip charge pump. In at least one embodiment, the electronic system includes one or more additional on-chip charge pumps to provide a gate boost voltage that boosts the gate voltage of at least one of the additional FETs. In at least one embodiment, the amount of gate boost voltage provided by each on-chip charge pump is fixed. In another embodiment, the amount of gate boost voltage is variable and depends on, for example, the voltage value of the supply voltage rail.

"On-chip" means that the referenced device is included in a single integrated circuit as part of an integrated circuit. For example, an "on-chip charge pump" is a charge pump that is included in a single integrated circuit as part of an integrated circuit.

Figure 4:
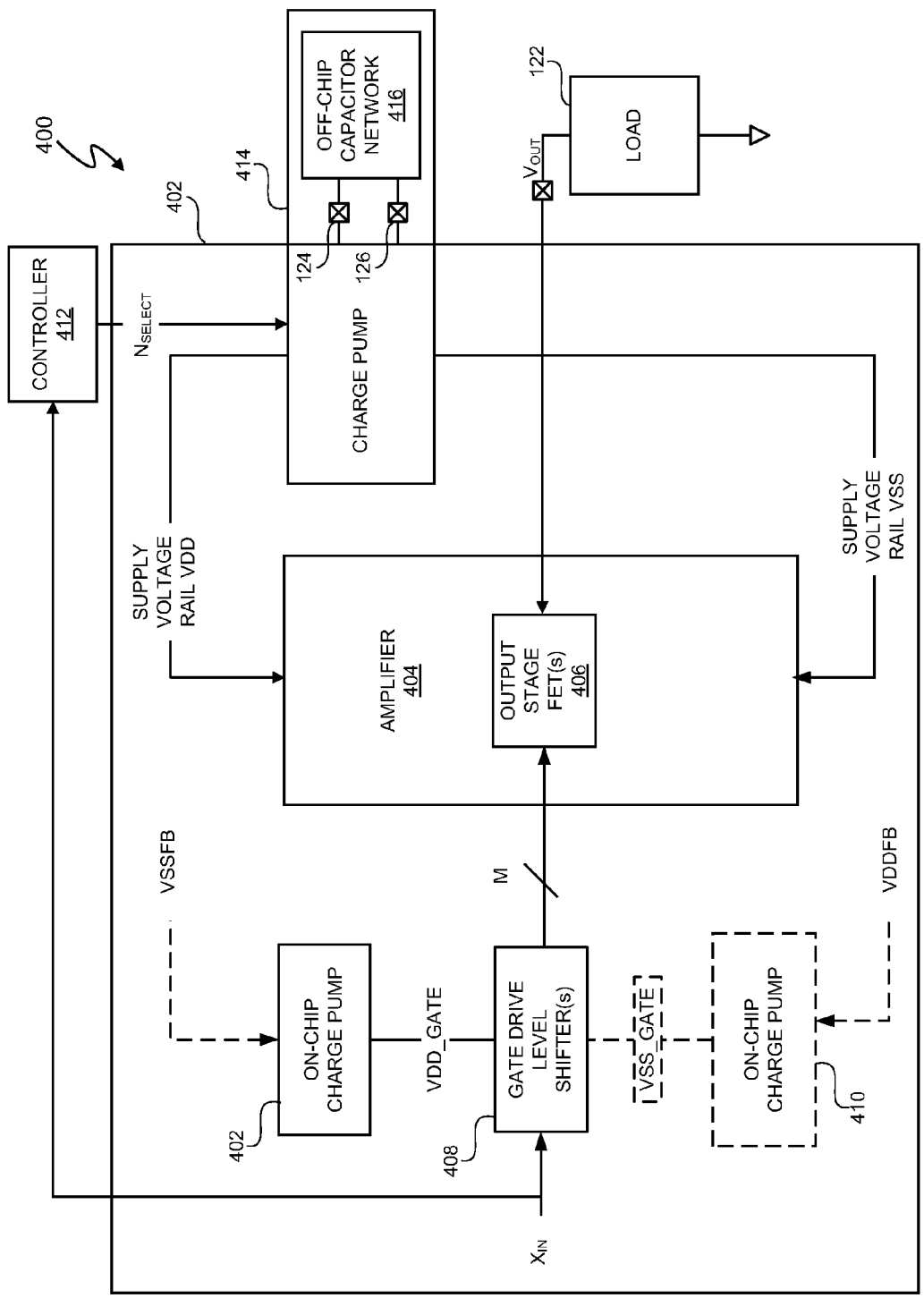
FIG. 4 depicts an embodiment of an electronic system that includes an on-chip charge pump to provide a DC bias gate boost voltage for an input signal.

FIG. 4 depicts an embodiment of an electronic system 400 that includes an on-chip charge pump 402 to provide a gate boost voltage VDD_GATE for an input signal $X_{IN}$. In at least one embodiment, the gate boost voltage VDD_GATE is a DC bias and is independent of input signal $X_{IN}$. Amplifier 404 includes one more output stage FETs 406 (also referred to as "drive FETs"). Boosting the DC bias voltage of input signal $X_{IN}$ boosts the overdrive voltage of at least one FET (not shown) in amplifier 404, thus, lowering the source-drain resistance of the output stage FET(s) 406 and allowing the maximum swing of output voltage $V_{OUT}$ to come closer to the supply voltage rails VDD and VSS relative to conventional amplifier designs. The source of input signal $X_{IN}$ is a matter of design choice. The input signal $X_{IN}$ can represent M signals, where M is an integer greater than or equal to one. For example, in at least one embodiment, the source of input signal $X_{IN}$ is a double-input, double ended output amplifier, M=2, and input signal $X_{IN}$ is a pair of complementary signals, such as signals i+ and i− in FIG. 1.

Electronic system 400 also includes gate drive level shifter(s) 408 to receive the gate boost voltage VDD_GATE from on-chip charge pump 402. The drive level shifter(s) 408 receive the input signal $X_{IN}$ and modify the DC bias of the input signal. In at least one embodiment, the number of on-chip charge pumps included in electronic system 400 depends on the type of amplifier 404 and the type and number of output stage FET(s) 406. In at least one embodiment, electronic system 400 includes one on-chip charge pump 402, and amplifier 404 is a class A amplifier that includes one output stage FET to amplify a single input signal $X_{IN}$.

The particular configuration and class of amplifier 404 is a matter of design choice. The number, type, configuration, and combination of on-chip charge pumps and output stage FETs 406 is also a matter of design choice. In at least one embodiment, amplifier 404 is a class AB amplifier and output stage FET(s) 406 includes an n-channel FET and a p-channel FET. In at least one embodiment, electronic system 400 includes an additional on-chip charge pump 410 to generate a gate boost voltage VSS_GATE for boosting the input signal component of input signal $X_{IN}$ applied to a gate of the p-channel FET. In at least one embodiment, output stage FET(s) 406 includes two n-channel FETs. In at least one embodiment, on-chip charge pump 402 provides gate boost voltage VDD_GATE to boost the gates of both n-channel FETs without any additional on-chip charge pumps for amplifier 404. In at least one embodiment, output stage FET(s) 406 include two PMOS FET(s), and on-chip charge pump 410 generates a gate boost voltage VSS_GATE for boosting the input signal components of input signal $X_{IN}$ applied to gates of the p-channel FETs.

In at least one embodiment, the gate boost voltages VDD_GATE and VSS_GATE are fixed at, for example, a process limit voltage of the output stage FET(s) 406. The process limit voltage refers to maximum gate voltage that can be applied to the gates of the output stage FET(s) 406 without damaging the output stage FET(s) 406. The process limit is a well-known quantity and is generally a function of the size of the output stage FET(s) 406 and the materials used to fabricate the output stage FET(s) 406. In at least one embodiment, the gate boost voltages VDD_GATE and VSS_GATE are dynamic and are adjusted to track the respective supply voltage rails VSS and VDD. Feedback signals VSSFB and VDDFB represent respective supply voltage rails VSS and VDD. Feedback signals VSSFB and VDDFB can be digital or analog.

Electronic system 400 also includes a controller 412 to cause charge pump 414 to vary the supply rail voltages VDD and VSS in accordance with the swing of output voltage $V_{OUT}$. Charge pump 414 includes an off-chip capacitor network 416 to assist in meeting current demands of amplifier 404 and load 122. In at least one embodiment, controller 412 provides class H control for amplifier 404. In at least one embodiment, charge pump 414 provides variable supply voltage rails so that supply voltage rail VDD equals VCP/N and supply voltage rail VSS equals −VCP/N, where N is a positive integer greater than or equal to one. Controller 412 generates control signal $N_{SELECT}$, which represents the value of N and, thus, the mode of charge pump 414. In at least one embodiment, controller 412 receives input signal $X_{IN}$ and sets the value of N according to the value of input signal $X_{IN}$ so that VCP/N is the minimum possible value for a given level of output signal $V_{OUT}$. In at least one embodiment, input signal $X_{IN}$ is sampled and converted into a digital signal for utilization by controller 412. In at least one embodiment, controller 412 functions in the same way as class H controller 120. However, in at least one embodiment, controller 412 can increase N to values greater than class H controller 120 because of the gate boost voltage provided by the on-chip charge pump(s) of electronic system 400.

In at least one embodiment, amplifier 404 includes multiple output stages such as the exemplary multiple output stages described in U.S. patent application Ser. No. 11/694, 348 (Publication No. US 2008/0174372 A1), filed on Mar. 30, 2007, published on Jul. 24, 2008, entitled "MULTI-STAGE AMPLIFIER WITH MULTIPLE SETS OF FIXED AND VARIABLE VOLTAGE RAILS", inventors John C. Tucker and Ammisetti V. Prasad, and assigned to Cirrus Logic, Inc. (referred to as "Tucker"). For multiple output stages, such as the multiple output stages described in Tucker, one or more on-chip charge pumps, such as on-chip charge pump 402 and 410, and one or more gate drive level shifter(s), such as gate drive level shifter(s) 408, to provide a gate boost voltage to FETs in one or more of the multiple output stages. Tucker is hereby incorporated by reference in its entirety.

Figure 5:
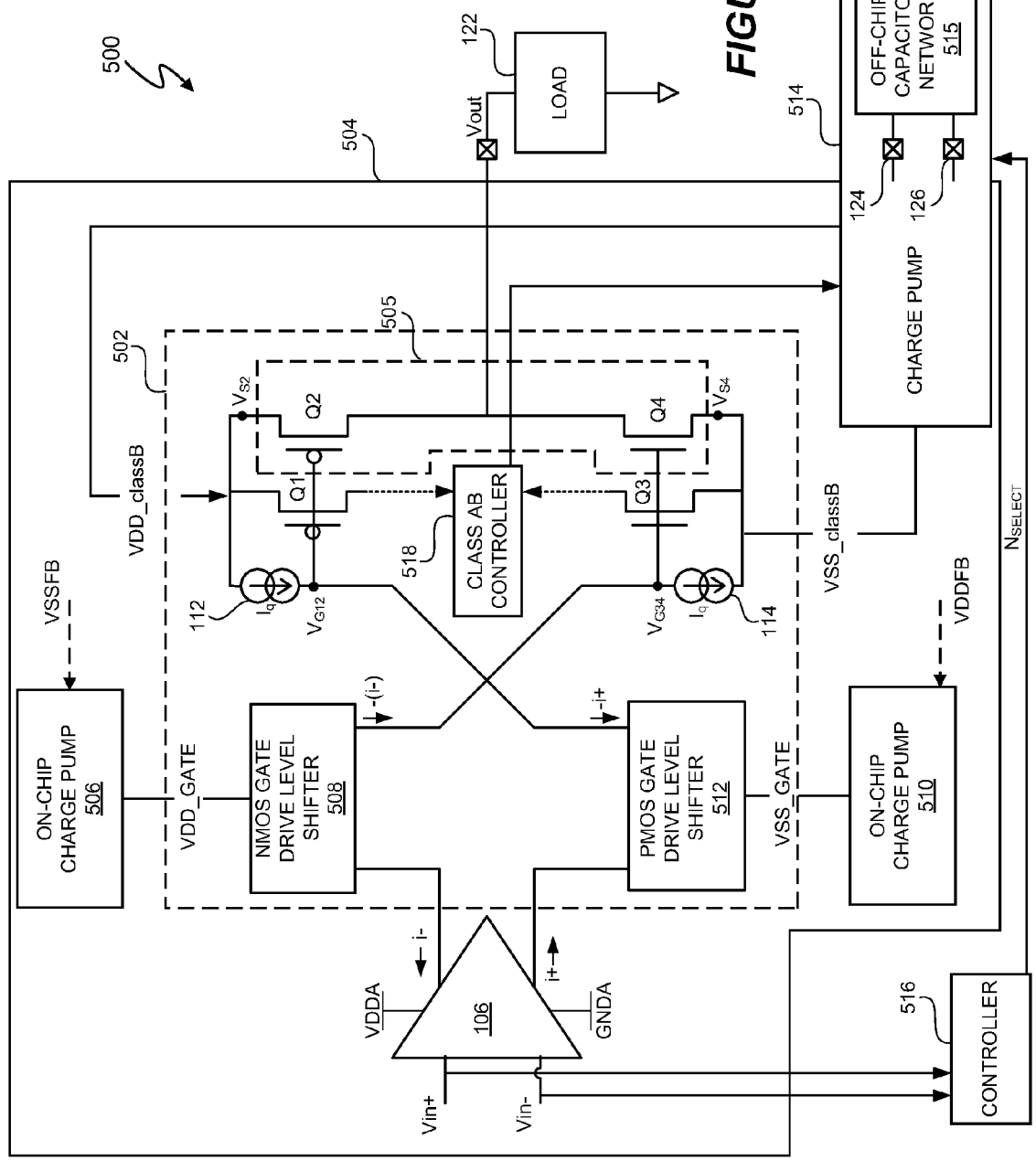
FIG. 5 depicts an embodiment of the electronic system of FIG. 4 with NMOS and PMOS FET output stages.

FIG. 5 depicts electronic system 500, and electronic system 500 represents one embodiment of electronic system 400. Electronic system 500 includes a class AB amplifier 502 fabricated as part of integrated circuit 504. Exemplary first stage amplifier 106 receives complementary signals $V_{IN}$+ and $V_{IN}$− and provides complementary input signals i+ and i− to amplifier 502. On-chip charge pump 506 generates gate boost voltage VDD_GATE. NMOS gate drive level shifter 508 boosts the DC bias of input signal i− by gate boost voltage VDD_GATE and reverses the direction of input signal i−.

On-chip charge pump 510 generates gate boost voltage VSS_GATE. PMOS gate drive level shifter 512 boosts the DC bias of input signal i+ by gate boost voltage VSS_GATE and reverses the direction of input signal i+. Charge pump 514 provides supply voltage rail VDD to PMOS FETs Q1 and Q2 and provides supply voltage rail VSS to FETs Q3 and Q4. Charge pump 514 represents one embodiment of charge pump 414. Charge pump 514 also includes off-chip capacitor network 515, connected to pins 124 and 126 of integrated circuit 504, to store charge for charge pump 514. FETs Q2 and Q4 represent an output stage 505 of amplifier 502.

Electronic system 500 includes class AB controller 518. Class AB controller 518 is connected to the drains of transistors Q1 and Q2 and controls conductivity of transistors Q1 and Q2 so that amplifier 502 operates as a class AB amplifier.

In at least one embodiment, on-chip charge pumps 506 and 510 generate respective varying gate boost voltages VDD_GATE and VSS_GATE depending on the values of respective voltage supply rails VDD_classB and VSS_classB. In at least one embodiment, on-chip charge pump 510 generates gate boost voltage VSS_GATE to maximize the gate-to-source voltage $V_{GS2}$ of FET Q2. The gate-to-source voltage $V_{GS2}$ equals the gate voltage $V_{G12}$ minus the source voltage $V_{S2}$. In at least one embodiment, two factors determine how low the gate voltage $V_{G12}$ can go: (1) process limits and (2) the value of gate boost voltage VSS_GATE. The process limit refers to the maximum gate voltage $V_{G12}$ that can be applied to the gates of FETs Q1 and Q2 without damaging FETs Q1 and Q2. The process limit is a well-known quantity and is generally a function of the size of FETs Q1 and Q2 and the materials used to fabricate FETs Q1 and Q2. The process limit can be specified as a VGS_MAX_PMOS for FETs Q1 and Q2. For example, for a 5V FET, the process limit would be 5V, for a 1.8V FET the process limit would be 1.8V, and so on. In at least one embodiment, to reach VGS_MAX_PMOS, on-chip charge pump 510 generates the gate boost voltage VSS_GATE so that the "efficient" gate boost voltage VSS_GATE equals to the voltage supply rail VDD_classB–VGS_MAX_PMOS, i.e. VSS_GATE=VDD_classB–VGS_MAX_PMOS.

Likewise, on-chip charge pump 506 generates gate boost voltage VDD_GATE to maximize the gate-to-source voltage $V_{GS4}$ of FET Q4. The gate-to-source voltage $V_{GS4}$ equals the gate voltage $V_{G34}$ minus the source voltage $V_{S4}$. In at least one embodiment, the two factors also determine how high the gate voltage $V_{G34}$ can go: (1) process limits and (2) the value of gate boost voltage VDD_GATE. The process limit refers to the maximum gate voltage $V_{G34}$ that can be applied to the gates of FETs Q3 and Q4 without damaging FETs Q3 and Q4. The process limit is well-known quantity and is generally a function of the size of FETs Q3 and Q4 and the materials used to fabricate FETs Q3 and Q4. The process limit can be specified as a VGS_MAX_NMOS for FETs Q3 and Q4. In at least one embodiment, to reach VGS_MAX_NMOS, on-chip charge pump 506 generates the gate boost voltage VDD_GATE so that the "efficient" gate boost voltage VDD_GATE equals the voltage supply rail VSS_classB+ VGS_MAX_NMOS, i.e. VDD_GATE=VSS_classB+ VGS_MAX_NMOS. Class H controller 506 represents one embodiment of controller 412. In at least one embodiment, the "efficient" gate boost voltages VDD_GATE and VSS_GATE combined with class H, variable voltage supply rail control by class H controller 516 allows amplifier 502 to behave as efficiently as possible for a given size of FET Q2.

In at least one embodiment, when generating a variable gate boost voltage VSS_GATE, charge pump 510 receives a feedback signal VSSFB, and charge pump 510 generates gate boost voltage VSS_GATE to track changes in voltage supply rail VDD_classB from VCP/1 to VCP/N. In this embodiment, charge pump 510 modifies the gate boost voltage VSS_GATE so that VSS_GATE equals VDD_classB–VGS_MAX_P-MOS. In at least one embodiment, when generating a variable gate boost voltage VDD_GATE, charge pump 506 receives feedback signal VDDFB, and charge pump 506 generates gate boost voltage VDD_GATE to track changes in voltage supply rail VDD_classB from VCP/1 to VCP/N. In this embodiment, charge pump 506 modifies the gate boost voltage VDD_GATE so that VDD_GATE equals VSS_classB+ VGS_MAX_NMOS. Feedback signals VSSFB and VDDFB represent respective supply voltage rails VSS_classB and VDD_classB. Feedback signals VSSFB and VDDFB can be digital or analog.

In another embodiment, on-chip charge pumps 506 and 510 generate respective fixed gate boost voltages VSS_GATE and VDD_GATE. In this embodiment, on-chip charge pumps 506 and 510 generate respective fixed gate boost voltages VSS_GATE and VDD_GATE so that gate boost voltages VSS_GATE and VDD_GATE do not cause the respective gate voltages $V_{G12}$ and $V_{G34}$ to violate the respective process limits VGS_MAX_PMOS and VGS_MAX_NMOS for all respective values of respective voltage supply rails VDD_classB and VSS_classB.

Generation of gate boost voltages VDD_GATE and VSS_GATE is independent on how charge pump 514 generates voltage supply rails VDD_classB and VSS_classB. In another embodiment, charge pump 514 is omitted, and voltage supply rails are supplied by a different power source, such as a DC/DC converter or some other type of power source. Additionally, the gate boost voltages VDD_GATE and VSS_GATE can be bipolar or a unipolar with, for example, voltage supply rail VSS_classB tied to ground.

Constant current sources 112 and 114 generate constant currents $i_q$ and cause the gate voltages $V_{G12}$ and $V_{G34}$ to respond to signals −(i−) and −i+ as described with respect to electronic system 100 (FIG. 1).

Figure 6A:
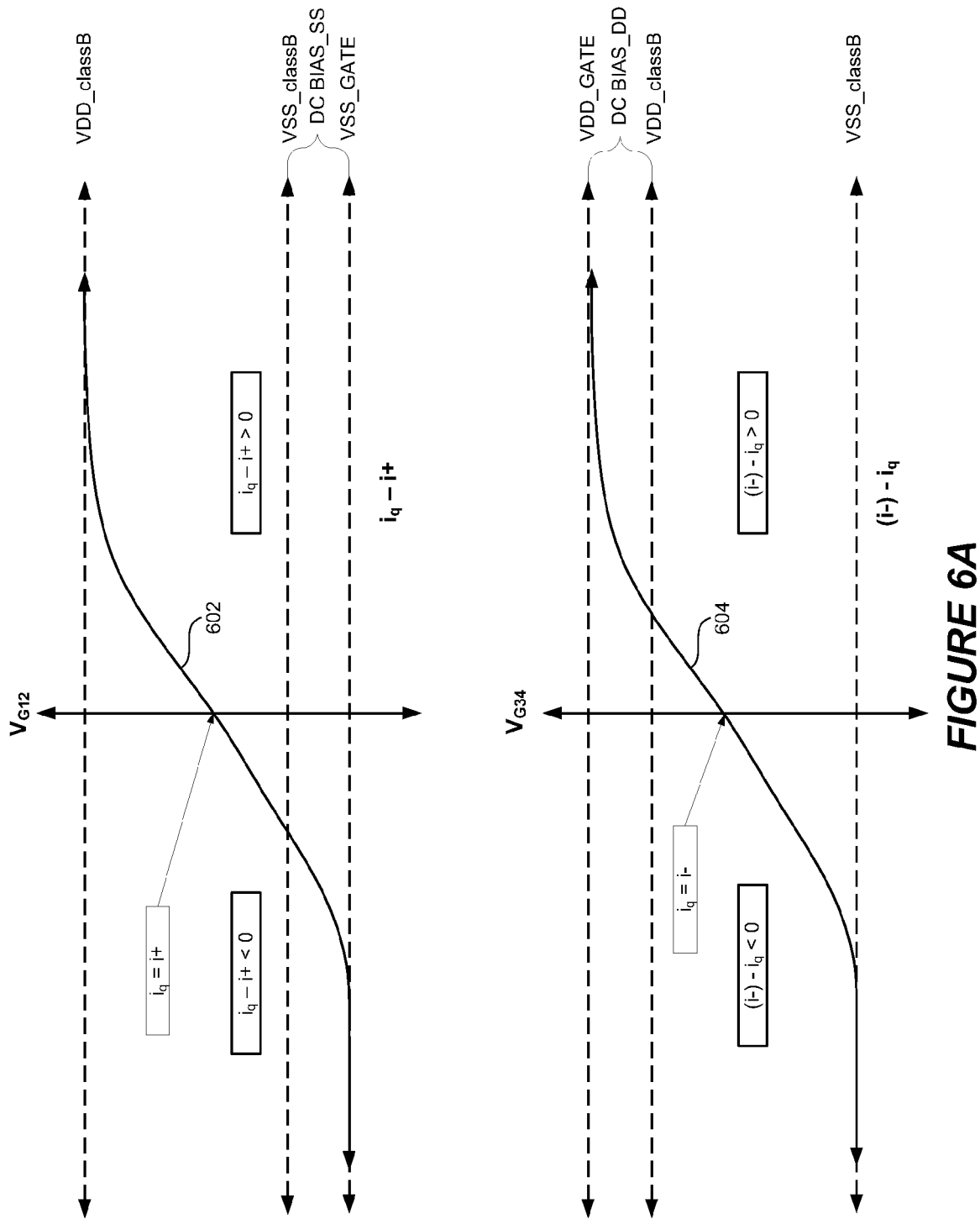
FIG. 6A depicts FET gate voltages for FETs in an output stage of the electronic system of FIG. 5 with on-chip charge pump derived gate voltages.

FIG. 6A depicts voltage waveform 602 and waveform 604 representing respective gate voltages. Referring to FIGS. 5 and 6A, waveform 602 represents the gate voltage $V_{G12}$ of FETs Q1 and Q2. Waveform 604 represents the gate voltage $V_{G34}$ of FETs Q3 and Q4. The gate voltage $V_{G12}$ and, thus, the gate-to-source voltage $V_{GS12}$ increases as signal i+. The gate voltage $V_{G34}$ and, thus, the gate-to-source voltage $V_{GS34}$ increases as signal i− increases. Additionally, the gate boost voltage VDD_GATE is increased above the supply voltage rail VDD_classB by the DC bias voltage DC BIAS_DD. The gate boost voltage VSS_GATE is decreased below the supply voltage rail VSS_classB by the DC bias voltage DC BIAS_SS. Increasing gate boost voltage VDD_GATE by the DC BIAS_DD increases the gate voltage $V_{G34}$ and, thus increases the overdrive voltage of output stage FET Q4. Likewise, decreasing gate boost voltage VSS_GATE by the DC BIAS_SS decreases the gate voltage $V_{G12}$ and, thus increases the overdrive voltage of output stage FET Q2. Increasing the overdrive voltages of FETs Q2 and Q4 allow the swing of output voltage $V_{OUT}$ to closely approach the respective voltage supply rails VDD_classB and VSS_classB.

Figure 6B:
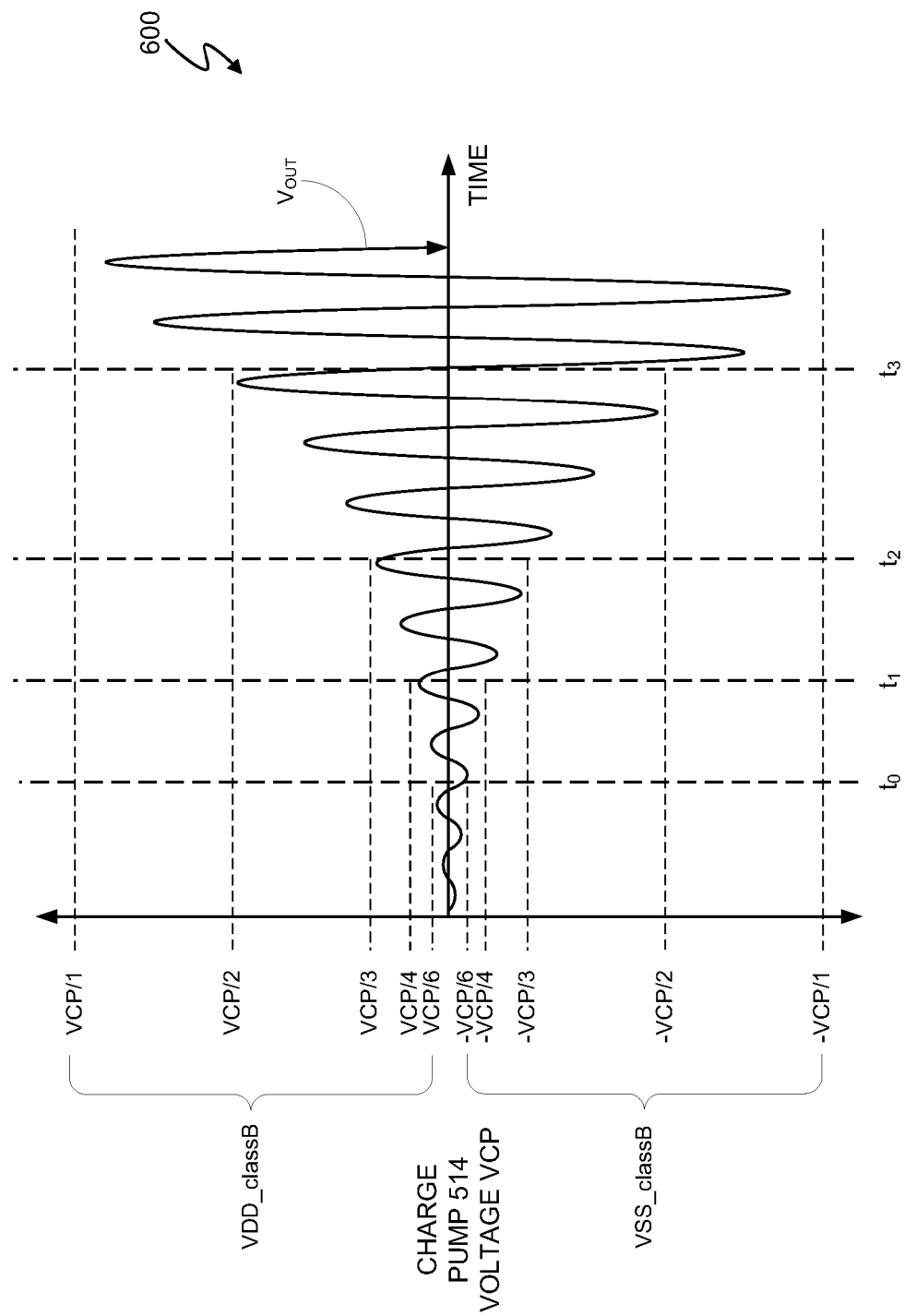
FIG. 6B depicts an output voltage and changes in the supply voltage rails by a class H controller for the electronic system of FIG. 5.

FIG. 6B depicts a variable voltage supply rail plot 600 over time for various swing levels of output voltage $V_{OUT}$. The value of N generated by class H controller 516 tracks the swing of output signal $V_{OUT}$ causing charge pumps 506 and 510 to generate voltage supply rails VDD_classB and VSS_classB that track the swing of output voltage $V_{OUT}$. Referring to FIGS. 5 and 6B, by increasing the gate boost voltages VDD_GATE and VSS_GATE, the swing of output voltage $V_{OUT}$ is significantly closer to the voltage supply rails VDD_classB and VSS_classB relative to the output voltage of electronic system 100 (FIG. 1). Thus, class H controller 516 can increase the value of N relative to the value of N generated by class H controller 120 (FIG. 1). In at least one embodiment, class H controller 516 generates values of N equal to 1, 2, 3, 4, and 6. For electronic system 500, until time $t_0$, N class H controller 516 sets N equal to 6. The swing of output voltage $V_{OUT}$ increases, and at time $t_0$, class H controller 516 sets N equal to 4. At time $t_1$, class H controller 516 sets N equal to 3. The swing of output voltage $V_{OUT}$ increases, and at time $t_2$, class H controller 516 sets N equal to 2. At time $t_3$, class H controller 516 sets N equal to 1. The value of N can be any number. Omitting intermediate values of N, such as N=5, is also a design choice. For example, for a maximum value of N=6, the difference between VCP/5 and VCP/6 may be too small to add significant efficiency gains that would justify adding the capability to charge pump 514 of generating VCP/5.

Figure 3:
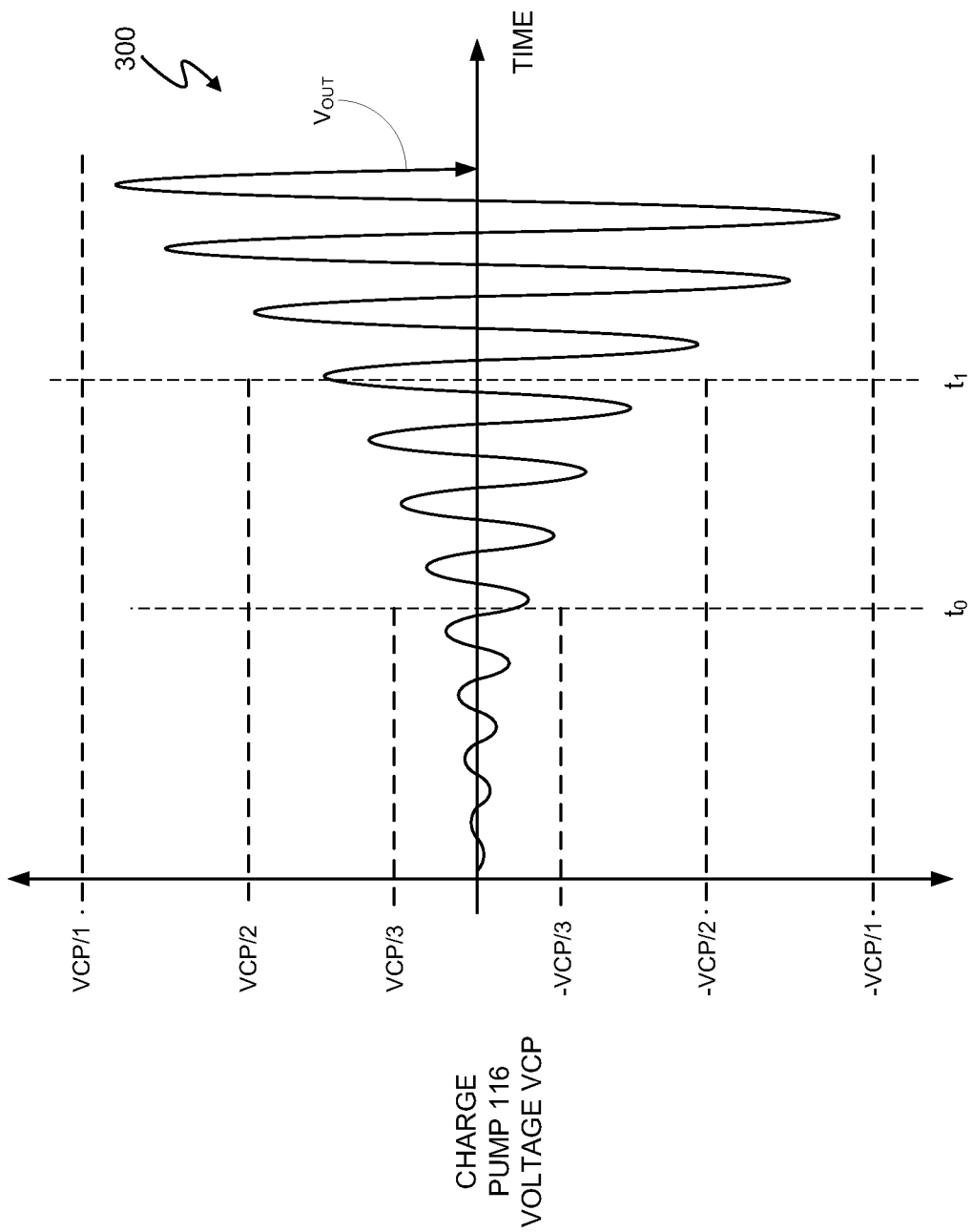
FIG. 3 (labeled prior art) depicts an output voltage and voltage supply rail voltage changes by the class H controller of FIG. 1.

Referring to FIGS. 3, 5, and 6, comparing output voltage 600 with output voltage 300, by increasing the respective gate voltages $V_{G12}$ and $V_{G34}$ to transistors Q2 and Q4, the signal swing of output voltage $V_{OUT}$ increases relative to the voltage supply rails VSS_classB and VDD_classB. In at least one embodiment, increasing the gate voltages $V_{G12}$ and $V_{G34}$ increases the efficiency of electronic system 500 and increases the available gradations of voltage supply rails VSS_classB and VDD_classB by allowing increases in the value of N.

Figure 7:
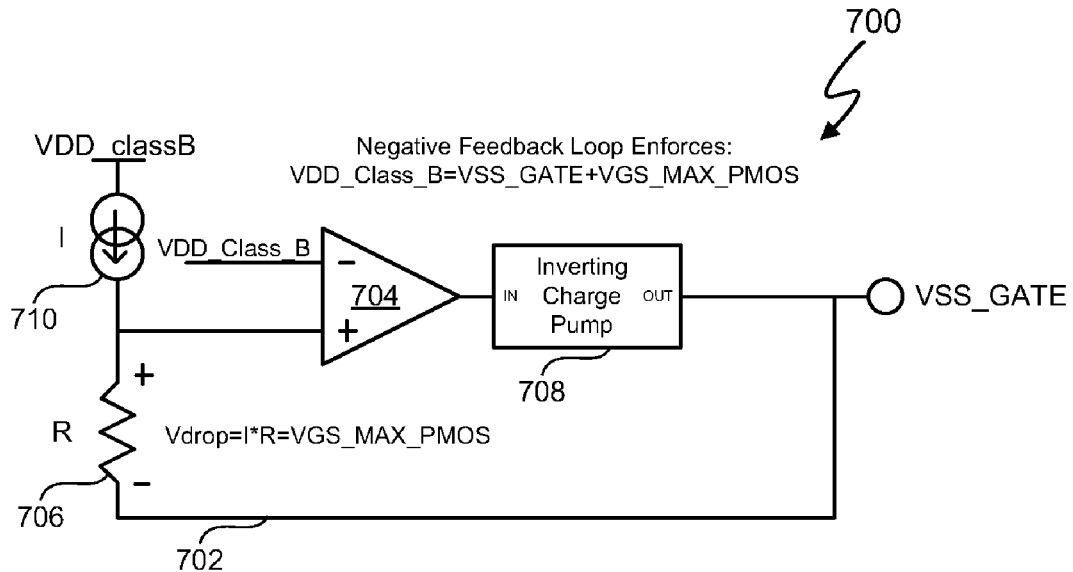
FIGS. 7 and 8 depict exemplary on-chip charge pumps.

FIG. 7 depicts charge pump 700, which represents one embodiment of charge pump 510 that $_{generates}$ gate boost voltage VSS_GATE. As previously described, the equation that governs the efficient value of VSS_GATE is VSS_GATE=VDD_classB−VGS_MAX_PMOS, which can be rearranged as VDD_classB=VSS_GATE+VGS_MAX_PMOS. Charge pump 700 includes a negative feedback loop 702 to maintain VSS_GATE+VGS_MAX_PMOS equal to voltage supply rail VDD_classB. The operational amplifier 704 is configured to force VSS_GATE+Vdrop to be equal to VDD_classB. "Vdrop" is a constant current from constant current source 710 fed into resistor 706. The voltage drop Vdrop can be sized to be equal to the process parameter VGS_MAX_PMOS. The output of operational amplifier 704 is the negative value of gate boost voltage VSS_GATE. For example, if gate boost voltage VSS_GATE is −1V then the output of the operational amplifier 704 is +1V. The output of the operational amplifier 704 is than passed through an inverting charge-pump 708. The inverting charge-pump 708 inverts the output voltage of operational amplifier 704. As VDD_classB changes the value of VSS_GATE will also change due to the negative feedback of feedback loop 702 so that VDD_classB=VSS_GATE+VGS_MAX_PMOS is maintained.

Figure 8:
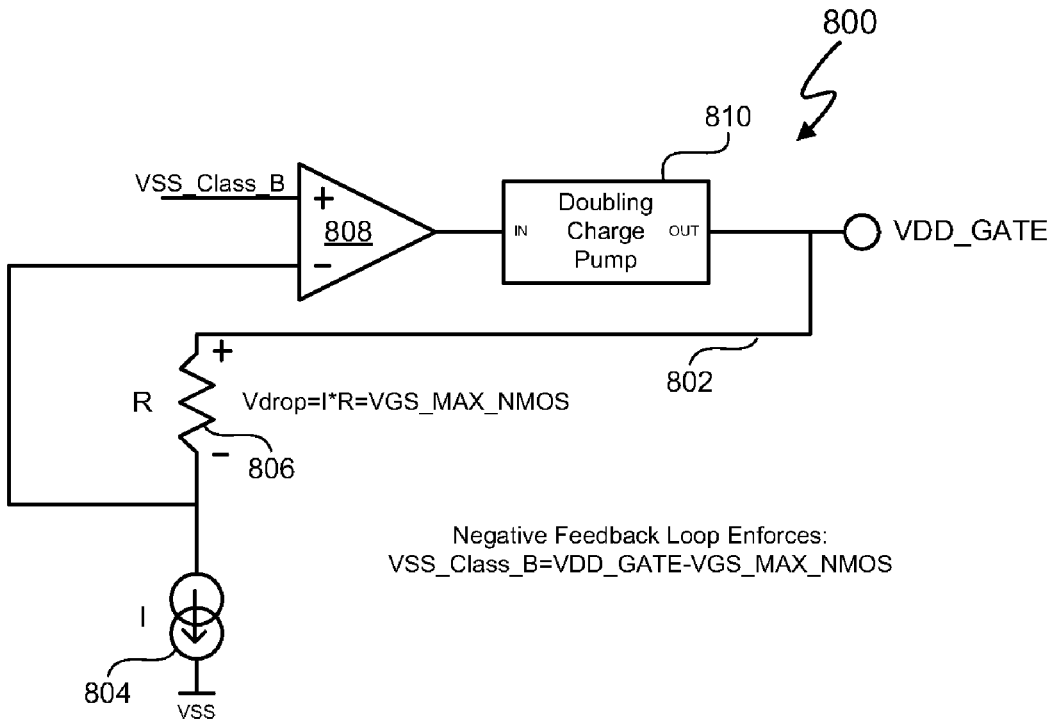

FIG. 8 depicts charge pump 800, which represents one embodiment of charge pump 506 to generate gate boost voltage VDD_GATE. The equation that governs the efficient value of VDD_GATE is VDD_GATE=VSS_classB+VGS_MAX_NMOS, which can be rearranged as VSS_classB=VDD_GATE−VGS_MAX_NMOS. As with charge pump 700 (FIG. 7), a negative feedback loop 802 maintains VDD_GATE−VGS_MAX_NMOS equal to voltage supply rail VSS_classB. Constant current source 804 generates current I so that the voltage drop Vdrop across resistor 806. Resistor 806 has a resistance of R, such that the I*R voltage drop Vdrop is equal to VGS_MAX_NMOS. Operational amplifier 808 ensures that VDD_GATE−Vdrop equals voltage supply rail VSS_classB. The output of operational amplifier 808 is fed into a doubling charge pump 810. A doubling charge-pump 810 is used because of the potential need for VDD_GATE to be greater than the available voltage supply rail VSS_classB. Therefore, the output of operational amplifier 808 is equal to half of VDD_GATE.

Charge pumps 700 and 800 represent just two of many possible implementations of the respective on-chip charge pumps 510 and 506. The particular implementations are matters of design choice. For example, in another embodiment, instead of closed loop systems, simpler open loop systems are used.

Figure 9:
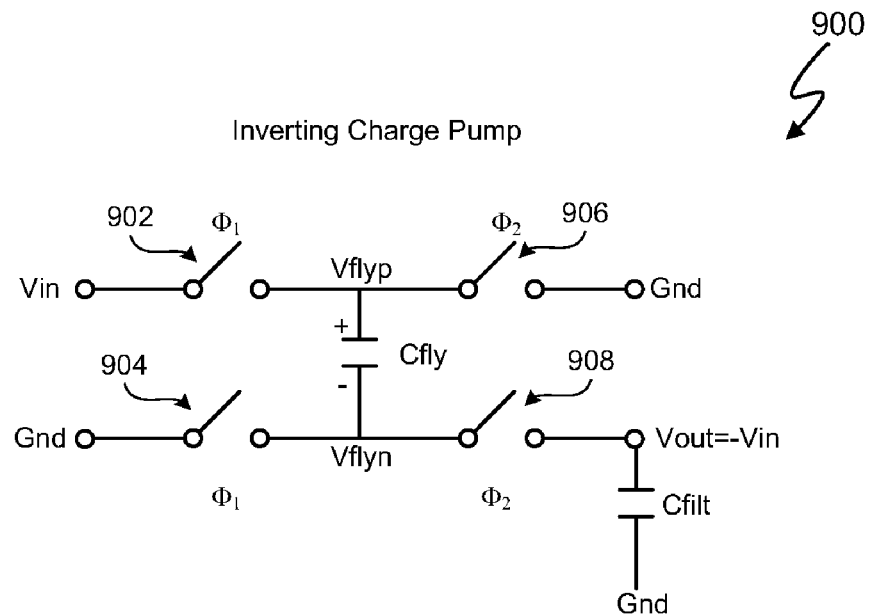
FIGS. 9 and 10 depict exemplary charge pumps within the charge pumps of respective FIGS. 7 and 8.

FIG. 9 depicts inverting charge pump 900, which represents one embodiment of inverting charge pump 708 (FIG. 7). Referring to FIGS. 7 and 9, charge pump 900 receives input voltage $V_{IN}$ from the output of operational amplifier 704. The four switches 902, 904, 906, and 908 are controlled by a two phase clock with phases $\Phi_1$ and $\Phi_2$. Switches 902 and 904 are controlled by phase $\Phi_1$, and switches 906 and 908 are controlled by phase $\Phi_2$. Capacitor Cfly is connected to the two nodes called Vflyp and Vflyn. Capacitor called Cfilt is connected to voltage node Vout.

In phase $\Phi_1$, switches 902 and 904 are closed, and switches 906 and 908 are open. Vflyp is charged to Vin, and Vflyn is charged to ground. The voltage across Cfly is 'Vin-ground'. In phase $\Phi_2$, switches 902 and 904 are open, and switches 906 and 908 are closed. Vflyp is now connected to ground and Vflyn is connected to voltage node Vout. Charge is maintained across Cfly when Vflyp goes from Vin in phase p$\Phi_1$ to ground in phase $\Phi_2$. Thus, Vflyn goes from ground in phase $\Phi_1$ to −Vin in phase $\Phi_2$. The voltage across Cfly in phase $\Phi_1$ and phase $\Phi_2$ is the same 'Vin-ground'. The capacitor Cfilt is used to hold the output voltage Vout to −Vin during phase $\Phi_1$ when Cfly is not connected to the output voltage node Vout.

Figure 10:
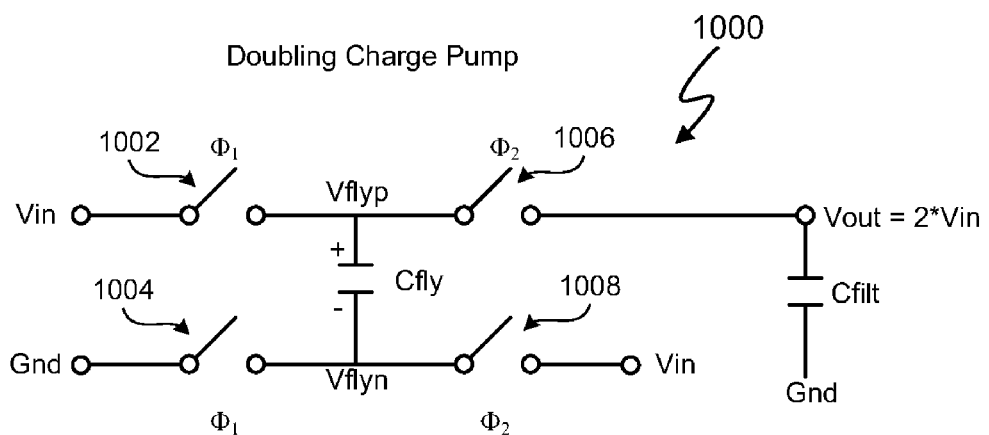

FIG. 10 depicts a doubling charge pump 1000, which represents one embodiment of doubling charge pump 810 (FIG. 8). Referring to FIGS. 8 and 10, doubling charge pump 1000 is very similar to the inverting charge pump 900 (FIG. 9) except instead of inverting the input voltage Vin from operational amplifier 808, doubling charge pump 1000 doubles the input voltage Vin. In phase $\Phi_1$, switches 1002 and 1004 are closed, and switches 1006 and 1008 are open. The positive terminal of capacitor Cfly is charged to Vin, and the negative terminal of capacitor Cfly is charged to ground. The voltage across capacitor Cfly in phase $\Phi_1$ is 'Vin-Ground'. In phase $\Phi_2$, switches 1002 and 1004 are open, and switches 1006 and 1008 are closed. The negative terminal of capacitor Cfly is now connected to Vin. Charge is maintained across capacitor Cfly, and the positive terminal of capacitor Cfly charges to 2*Vin. The voltage across capacitor Cfly in phase $\Phi_2$ is '2*Vin−Vin' which is the same voltage that was across the capacitor Cfly in phase $\Phi_1$. As with inverting charge pump 900, capacitor Cfilt is used to hold the voltage Vout to 2*Vin during phase $\Phi_1$ when the capacitor Cfly is not connected to the output node Vout.

Figure 11:
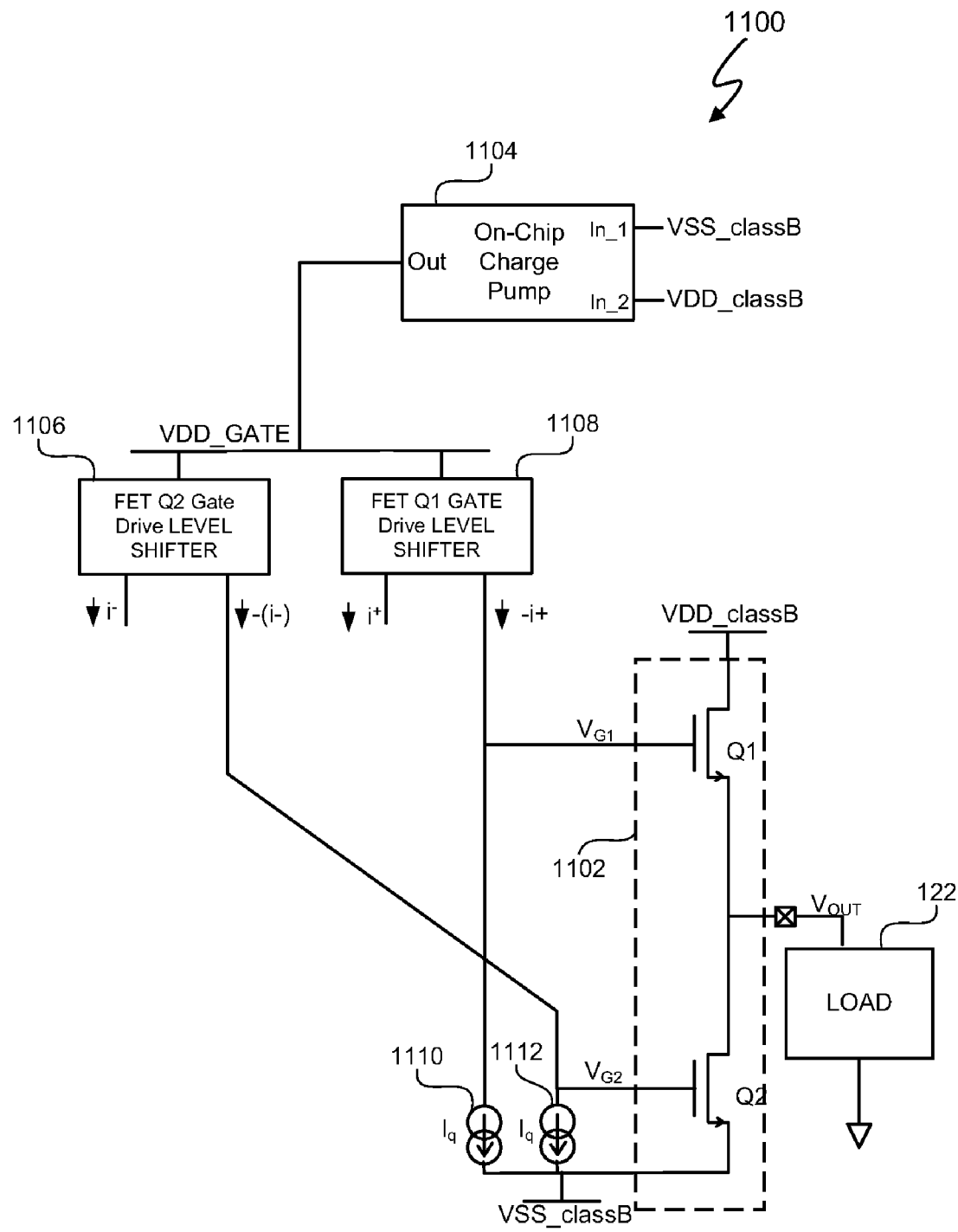
FIG. 11 depicts an all NMOS FET output stage and gate voltage boost system for the electronic system of FIG. 5.

FIG. 11 depicts an all NMOS FET output stage and gate voltage boost system 1100. In at least one embodiment, output stage and gate voltage boost system 1100 substitutes for on-chip charge pumps 506 and 510, level shifters 508 and 512, and FETs Q2 and Q4 of electronic system 500. In at least one embodiment, signals i− and i+ are generated in the same manner as described with respect to electronic system 500 (FIG. 5). A class H controller and feedback FETs to the class H controller are omitted from FIG. 11 for clarity.

The output stage and gate voltage boost system 1100 includes two NMOS FETs Q1 and Q2 for the output stage 1102 instead of FETs Q1 and Q2 in the output stage of amplifier 504 (FIG. 5). FET Q2 is connected as a commonsource device. Device Q1 replaces the PMOS FET Q1 of FIG. 5. FET Q1 is connected as a source-follower. Output stage and gate voltage boost system 1100 has one on-chip charge pump 1104. On-chip charge pump 1104 generates the gate boost voltage VDD_GATE for both FETs Q1 and Q2. In at least one embodiment, voltage supply rails VDD_classB and VSS_classB are set by a class H controller to increase efficiency of the output stage 1102. In at least one embodiment, the gate boost voltage VDD_GATE is governed by two equations, one equation for FET Q2 and one equation for FET Q1. For FET Q2:

$$V_{DD\_GATE} = V_{SS\_classB} + V_{GS\_MAX\_NMOS} \quad [1].$$

For FET Q1:

$$V_{DD\_GATE} \geq V_{DD\_classB} + V_{GS\_Q1} \quad [2].$$

Equation 1 is the same equation that governs the gate boost voltage VDD_GATE for the FET Q2 of electronic system 500. For FET Q1 of system 1100, the gate boost voltage VDD_GATE is preferably large enough to allow the output signal voltage $V_{OUT}$ to swing to the voltage supply rail VDD_classB. Since FET Q1 is connected as a source follower device, for the output voltage $V_{OUT}$ swing to the voltage supply rail VDD_classB, the gate voltage $V_{G1}$ of FET Q1 is driven above the supply voltage rail VDD_classB by the threshold voltage Vt plus the gave voltage $V_{G1}$ of FET Q1 as set forth in Equation (2).

So, in at least one embodiment, the gate boost voltage VDD_GATE is constrained by two equations. In at least one embodiment, the gate boost voltage VDD_GATE is greater than or equal to equation [2] and less than equation [1]. If VDD_GATE is greater than the Equation [1] value, then either the gate of FET Q2 could be over-stressed because it would violate the VGS_MAX_NMOS voltage or protection circuitry can be added to stop the gate voltage $V_{GS2}$ of FET Q2 from violating the process maximum voltage VGS_MAX_NMOS. Violating Equation [1] to satisfy Equation [2] should only happen when the voltage supply rail VDD_classB and VSS_classB are large enough to exceed the ability of on-chip charge pump 1104 to generate gate boost voltage VDD_GATE. Otherwise, for smaller values of voltage supply rails VDD_classB and VSS_classB, on-chip charge pump 1104 can generate gate boost voltage VDD_GATE to satisfy both Equations [1] and [2]. Constant current sources 1110 and 1112 provide constant currents $i_q$ to change the signal voltage at respective gates of FETs Q1 and Q2 in accordance with changes in respective signals −i+ and −(i−). FET Q2 gate drive level shifter 1106 and FET Q1 level shifter 1108 function in the same manner as level shifter 508 (FIG. 5).

FIG. 12 depicts level shifter 1200, which represents one embodiment of NMOS gate drive level shifter 508. Level shifter 1200 is a conventional current mirror with a diode connected PMOS FET Mp1. The gate of PMOS FET Mp2 is connected to the gate of PMOS FET Mp1 so that the drain currents of PMOS FETs Mp1 and Mp2 are equal. The source voltage VDD_GATE level shifts the signal −(i−) to provide the gate boost voltage for FET Q4 (FIG. 5).

FIG. 13 depicts level shifter 1300, which represents another embodiment of NMOS gate drive level shifter 508. Level shifter 1300 is a cascode current mirror. PMOS FETs Mp1 and Mp2 are connected as a current mirror with connected gates, and the gate of FET Mp1 is connected to the drain of PMOS FET Mp3. PMOS FETs Mp3 and Mp4 have gates connected to a voltage bias Vbias_p and are configured as cascade devices. The source voltage VDD_GATE level shifts the signal −(i−) to provide the gate boost voltage for FET Q4 (FIG. 5).

FIG. 14 depicts level shifter 1400, which represents one embodiment of PMOS gate drive level shifter 512. NMOS FET Mn1 is diode connected and has a gate connected to a gate of NMOS FET Mn2. The current of signal i+ is mirrored in the current of signal −i+. The source voltage VSS_GATE level shifts the signal −i+ to provide the gate boost voltage for FET Q2 (FIG. 5).

FIG. 15 depicts level shifter 1500, which represents another embodiment of PMOS gate drive level shifter 512. Level shifter 1500 is a cascode current mirror. NMOS FETs Mn1 and Mn2 are connected as a current mirror with connected gates, and the gate of FET Mn1 is connected to the drain of NMOS FET Mn3. NMOS FETs Mn3 and Mn4 have gates connected to a voltage bias Vbias_n and are configured as cascade devices. The source voltage VDD_GATE level shifts the signal −(i−) to provide the gate boost voltage for FET Q2 (FIG. 5).

Thus, in at least one embodiment, an electronic system includes an amplifier having at least one on-chip charge pump to provide a gate boost voltage to boost a gate voltage of at least one on-chip field effect transistor (FET) of an output stage of a variable voltage supply rail amplifier.

Although the present invention has been described in detail, it should be understood that various changes, substitutions and alterations can be made hereto without departing from the spirit and scope of the invention as defined by the appended claims.

What is claimed is:

1. An apparatus comprising:
an amplifier having a first on-chip field effect transistor (FET), wherein the first on-chip FET includes a gate, a source, and a drain, wherein during operation of the first on-chip FET, the first on-chip FET operates from a first voltage supply rail supplied by a power supply; and
a first on-chip charge pump, coupled to the first on-chip FET, to generate a variable gate boost voltage to the gate of the first on-chip FET to boost a voltage of an input signal to the gate of the first on-chip FET, wherein the first on-chip charge pump is distinct from the power supply and the variable boost voltage tracks changes in the first voltage supply rail.

2. The apparatus of claim 1 wherein the first voltage supply rail is a variable voltage supply rail having a voltage that is related to a swing of an output voltage of the amplifier.

3. The apparatus of claim 1 wherein the charge pump is configured to provide a maximum overdrive voltage to the first on-chip FET in accordance with gate-to-source voltage process limits of the first on-chip FET.

4. The apparatus of claim 1 wherein the amplifier is configured as a class A amplifier.

5. The apparatus of claim 1 wherein the amplifier further comprises a second on-chip FET coupled to the first on-chip FET, wherein the second on-chip FET includes a gate, a source, and a drain, wherein during operation of the second on-chip FET, the second on-chip FET operates from a second voltage supply rail supplied by the power supply.

6. The apparatus of claim 5 wherein the amplifier is configured as a member of a group consisting of: a class B amplifier, a class AB amplifier, and a class D amplifier.

7. The apparatus of claim 5 wherein the first on-chip FET is a p-channel FET and the second on-chip FET is an n-channel FET.

8. The apparatus of claim 5 wherein the first on-chip FET and the second on-chip FET are n-channel FETs.

9. The apparatus of claim 5 wherein the second on-chip FET is coupled to the first on-chip charge pump and, during operation of the second on-chip FET, the first on-chip charge pump is further configured to boost a gate voltage to the gate of the second on-chip FET.

10. The apparatus of claim 5 further comprising:
a second on-chip charge pump, coupled to the second on-chip FET, to boost a gate voltage to the gate of the second on-chip FET, wherein the second on-chip charge pump is distinct from the power supply.

11. The apparatus of claim 1 provides a fixed boost voltage to the gate of the first on-chip FET.

12. A method comprising:
generating a first supply voltage rail to supply a voltage to a first on-chip field effect transistor (FET) of an output stage of an amplifier; and
generating a first gate boost voltage to boost a voltage of an input signal to a gate of the first on-chip FET, wherein the first gate boost voltage is generated by a first on-chip charge pump that is distinct from a power supply generating the supply voltage rail, wherein generating a first gate boost voltage further comprises generating a variable boost voltage to the gate of the first on-chip FET, wherein the variable boost voltage tracks changes in the first voltage supply rail.

13. The method of claim 12 further comprising:
varying the first supply voltage rail in relation to a swing of an output voltage of the amplifier.

14. The method of claim 12 wherein generating the first gate boost voltage further comprises generating a maximum overdrive voltage for the first on-chip FET in accordance with gate-to-source voltage process limits of the first on-chip FET.

15. The method of claim 12 further comprising:
operating the amplifier as a class A amplifier.

16. The method of claim 12 further comprises:
generating a second supply voltage rail to supply a voltage to a second on-chip FET of the amplifier output stage.

17. The method of claim 16 further comprising:
operating the amplifier as a member of a group consisting of: a class B amplifier, a class AB amplifier, and a class D amplifier.

18. The method of claim 16 further comprising:
providing the first gate boost voltage to boost a gate voltage of a gate of the second on-chip FET.

19. The method of claim 16 further comprising:
generating a second gate boost voltage to boost a gate voltage of a gate of the first on-chip FET, wherein the gate boost voltage is generated by a second on-chip charge pump.

20. The method of claim 19 further comprising:
generating a second supply voltage rail to supply a voltage to a first on-chip field effect transistor (FET) of the output stage of the amplifier, wherein the second gate boost voltage is generated by a second on-chip charge pump that is distinct from a power supply generating the supply voltage rail.

21. The method of claim 12 wherein generating a first gate boost voltage further comprises generating a fixed first gate boost voltage.

22. An apparatus comprising:
a first field effect transistor (FET);
a second FET, coupled to the first FET, wherein the first and second FETs are configured to comprise an output stage of an amplifier;
a power supply to provide at least one voltage rail to at least one of the first and second FETs;
a first level shifter coupled to a gate of the first FET;
a second level shifter coupled to a gate of the second FET;
a first on-chip charge pump, coupled to at least one of the first and second level shifters, to provide a gate boost voltage to the first and second level shifters to boost a gate voltage of at least one of the first and second FETs.

23. The apparatus of claim 22 further comprising:
a second on-chip charge pump, coupled to the second level shifter, to provide a gate boost voltage to the second level shifter to boost a gate voltage of the second FET.

24. An apparatus comprising:
means for generating a first supply voltage rail to supply a voltage to a first on-chip field effect transistor (FET) of an output stage of an amplifier; and
means for generating a first gate boost voltage to boost a voltage of an input signal to a gate of the first on-chip FET, wherein the first gate boost voltage is generated by a first on-chip charge pump that is distinct from a power supply generating the supply voltage rail, wherein generating a first gate boost voltage further comprises generating a variable boost voltage to the gate of the first on-chip FET, wherein the variable boost voltage tracks changes in the first voltage supply rail.

25. An apparatus comprising:
an amplifier having a first on-chip field effect transistor (FET), wherein the first on-chip FET includes a gate, a source, and a drain, wherein during operation of the first on-chip FET, the first on-chip FET operates from a first voltage supply rail supplied by a power supply; and
a first on-chip charge pump, coupled to the first on-chip FET, to generate a gate boost voltage to boost a voltage of an input signal to the gate of the first on-chip FET, wherein the first on-chip charge pump is distinct from the power supply;
wherein the amplifier further comprises a second on-chip FET coupled to the first on-chip FET, wherein the second on-chip FET includes a gate, a source, and a drain, wherein during operation of the second on-chip FET, the second on-chip FET operates from a second voltage supply rail supplied by the power supply; and
wherein the second on-chip FET is coupled to the first on-chip charge pump and, during operation of the second on-chip FET, the first on-chip charge pump is further configured to boost a gate voltage to the gate of the second on-chip FET.

26. A method comprising:
generating a first supply voltage rail to supply a voltage to a first on-chip field effect transistor (FET) of an output stage of an amplifier;
generating a first gate boost voltage to boost a voltage of an input signal to a gate of the first on-chip FET, wherein the first gate boost voltage is generated by a first on-chip charge pump that is distinct from a power supply generating the supply voltage rail;
generating a second supply voltage rail to supply a voltage to a second on-chip FET of the amplifier output stage; and
providing the first gate boost voltage to boost a gate voltage of a gate of the second on-chip FET.

27. A method comprising:
generating a first supply voltage rail to supply a voltage to a first on-chip field effect transistor (FET) of an output stage of an amplifier;
generating a first gate boost voltage to boost a voltage of an input signal to a gate of the first on-chip FET, wherein the first gate boost voltage is generated by a first on-chip charge pump that is distinct from a power supply generating the supply voltage rail;

generating a second supply voltage rail to supply a voltage to a second on-chip FET of the amplifier output stage; and generating a second gate boost voltage to boost a gate voltage of a gate of the first on-chip FET, wherein the gate boost voltage is generated by a second on-chip charge pump.

28. An apparatus comprising:

an amplifier having a first on-chip field effect transistor (FET), wherein the first on-chip FET includes a gate, a source, and a drain, wherein during operation of the first on-chip FET, the first on-chip FET operates from a first voltage supply rail supplied by a power supply, wherein the first voltage supply rail is a variable voltage supply rail having a voltage that is related to a swing of an output voltage of the amplifier; and a first on-chip charge pump, coupled to the first on-chip FET, to generate a gate boost voltage to boost a voltage of an input signal to the gate of the first on-chip FET, wherein the first on-chip charge pump is distinct from the power supply.

29. A method comprising:

generating a first supply voltage rail to supply a voltage to a first on-chip field effect transistor (FET) of an output stage of an amplifier;

generating a first gate boost voltage to boost a voltage of an input signal to a gate of the first on-chip FET, wherein the first gate boost voltage is generated by a first on-chip charge pump that is distinct from a power supply generating the supply voltage rail; and varying the first supply voltage rail in relation to a swing of an output voltage of the amplifier.

* * * * *